(12) United States Patent
Okada et al.

(10) Patent No.: US 6,635,392 B2
(45) Date of Patent: Oct. 21, 2003

(54) DATA PROCESSING APPARATUS, METHOD AND PROGRAM PRODUCT FOR COMPENSATING FOR PHOTO PROXIMITY EFFECT WITH REDUCED DATA AMOUNT, AND PHOTOMASK FABRICATED USING SAME

(75) Inventors: Tomoyuki Okada, Kawasaki (JP); Yoshimasa Iiduka, Kawasaki (JP); Kazuhiko Takahashi, Kawasaki (JP); Masahiko Minemura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 09/764,162

(22) Filed: Jan. 19, 2001

(65) Prior Publication Data

US 2001/0028981 A1 Oct. 11, 2001

(30) Foreign Application Priority Data

Apr. 10, 2000 (JP) .......................... 2000-113199

(51) Int. Cl.⁷ ............................. G03F 9/00; G03C 5/00
(52) U.S. Cl. ............................ 430/5; 430/296; 430/394
(58) Field of Search .................... 430/5, 296, 394, 430/322; 716/19, 21

(56) References Cited

U.S. PATENT DOCUMENTS 6,214,494 B1 * 4/2001 Bula et al. ................. 430/5
6,329,107 B1 * 12/2001 Lu ............................. 430/5

FOREIGN PATENT DOCUMENTS

JP 58-200238 11/1983

\* cited by examiner

*Primary Examiner*—S. Rosasco
(74) *Attorney, Agent, or Firm*—Staas & Halsey LLP

(57) ABSTRACT

Provided is a computer 15 for producing corrected pattern data which includes corrected features each obtained by adding auxiliary features (serifs) to the right-angle corners of an original feature to compensate for the photo proximity effect. The computer performs the step of: (S1) inputting an original pattern data; (S2) adding triangle or rectangle serifs to right-angle corners of original features, each serif having a side which is an extension of a first side of a corresponding original feature and another side which is a portion of the side adjacent to the first side; (S3) performing a geometric OR operation on the original feature and the serifs to obtain a synthesized feature; and (S4) decomposing the synthesized feature into basic figures which can be processed in an electron beam exposure apparatus.

11 Claims, 10 Drawing Sheets

DATA PROCESSING APPARATUS, METHOD AND PROGRAM PRODUCT FOR COMPENSATING FOR PHOTO PROXIMITY EFFECT WITH REDUCED DATA AMOUNT, AND PHOTOMASK FABRICATED USING SAME

BACKGROUND OF THE INVENTION

1. Field of the Invention

The present invention relates to a data processing apparatus, a method and a program product for compensating for the photo proximity effect in order to sharpen rounded corners with a reduced amount of data, and a photomask fabricated using the same, for use in fabrication of semiconductor integrated circuit devices.

2. Description of the Related Art

In transferring the pattern of a semiconductor integrated circuit, exposure is performed by illuminating a photomask with light and thereby projecting the mask pattern onto a photoresist layer formed on a semiconductor wafer with reducing the size of the pattern.

In order to improve an integration degree and the operating speed of a circuit, a mask pattern has been miniaturized, and therefore, light passing through a photomask diffracts to cause the optical proximity effect on a wafer, thereby lowering a final transferred pattern resolution. For example, a rectangular feature 10 of a mask pattern as shown in FIG. 8(A) is transferred from the photomask to a photoresist on the wafer, and the final transferred pattern feature is round as shown in FIG. 8(B) due to underexposure at each convex corner.

In photomask fabrication, an electron beam or a short-wavelength laser beam has been employed for exposure in order to obtain a fine final pattern with high accuracy.

In a case where the electron beam is employed in photomask fabrication, as shown in FIG. 9(A), auxiliary features (serifs) 11 to 14 are synthesized for the respective corners of the original rectangular feature 10 in a photomask pattern in order to compensate for the proximity effect to obtain a final transferred rectangular feature as shown in FIG. 9(B).

In a case where the laser beam is employed in photomask fabrication, as shown in FIG. 10(A), auxiliary features (serifs) 21 to 24 are synthesized for the respective corners of the original rectangular feature 10 in a photomask pattern in order to compensate for the proximity effect to obtain a final transferred rectangular feature as shown in FIG. 9(B).

However, by adding auxiliary features to each original feature, the number of features increases by a great deal, which causes not only a data volume to become extremely large, but also an exposure time for scanning with a beam spot to become longer.

For example, in the case of FIG. 9(A), the number of figures in the corrected feature is 5 times that of the original feature 10. In the case of FIG. 10(A), since it is required to decompose each of the auxiliary features 21 to 24 into basic figures which can be processed in an exposure apparatus. As shown in FIG. 10(B), a triangle ABC of the serif 21a for example has to be decomposed into triangles ADO and OBO, each of which has a side being parallel with a side of the original feature 10. As a result, the number of figures in the corrected feature is 9 times that of the original feature 10.

SUMMARY OF THE INVENTION

Accordingly, it is an object of the present invention to provide a data processing apparatus, a method, a program product, and a photomask fabricated using the same, capable of not only suppressing an increase in the amount of corrected pattern data due to addition of auxiliary features but also effectively compensating for the optical proximity effect.

In one aspect of the present invention, a photomask has a corrected pattern having an original feature and first and second auxiliary features for the original feature. The first and second auxiliary features are added to both adjacent corners of the original feature. The both adjacent corners are located at both ends of a first side of the original feature. Each of the auxiliary features is a figure of a triangle or a tetragon, and the figure has one side which is an extension of the first side, and another side which is a portion of a second side of the original feature, the second side being adjacent to the first side.

With such a configuration, compensation for the proximity effect can be effectively performed. Further, in producing a corrected photomask pattern data, an enormous increase in the number of figures due to addition of auxiliary features can be suppressed.

Other aspects, objects, and the advantages of the present invention will become apparent from the following detailed description taken in connection with the accompanying drawings.

BRIEF DESCRIPTION OF THE DRAWINGS

FIGS. 8(A) and 8(B) are illustrations for explaining the proximity effect, wherein FIG. 8(A) shows an original feature on a photomask, and FIG. 8(B) shows a final transferred feature obtained by using a photomask on which the feature of FIG. 8(A) is formed.

DESCRIPTION OF THE PREFERRED EMBODIMENTS

Figure 1:
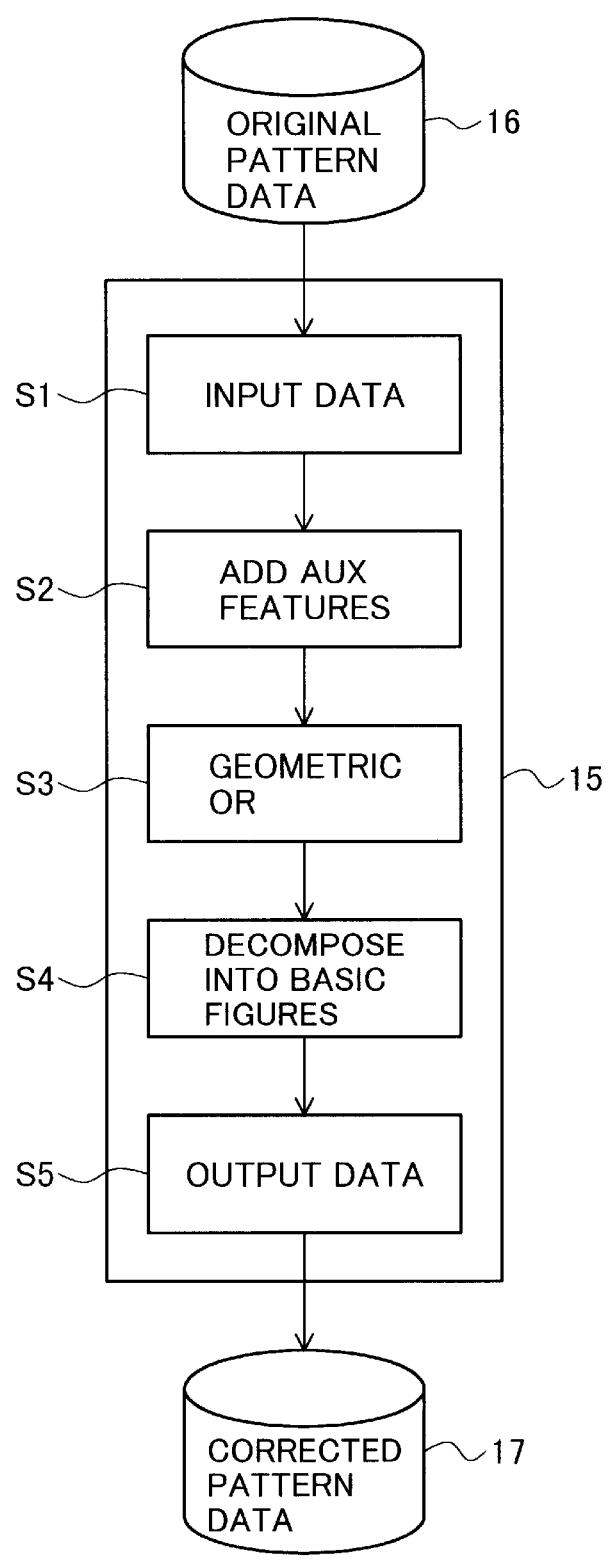
FIG. 1 is a schematic functional block diagram of a data processing apparatus for compensating for the proximity effect to obtain a corrected final transferred pattern by adding auxiliary features to original features of a photomask pattern.

Referring now to the drawings, wherein like reference characters designate like or corresponding parts throughout several views, preferred embodiments of the present invention are described below.

First Embodiment

FIG. 1 is a schematic functional block diagram of a data processing apparatus for compensating for the proximity effect to obtain a corrected final transferred pattern 15 by adding auxiliary features to an original feature, equipped with a computer.

An original pattern data file 16 is of a designed pattern data. A corrected pattern data file 17 is obtained through processing data of the file 16 by the apparatus 15, and the format of the file 17 is converted to obtain exposure data for an exposure apparatus. For fabrication of a photomask, exposure is performed by scanning an electron beam spot on a mask blank having a resist film with using the converted data in the exposure apparatus.

Next, description will be given of processing in the apparatus 15 with reference to FIGS. 2(A), 2(B), 3(A) and 3 (B).

(S1) Data are read onto a memory from the original pattern data file 16, wherein the pattern is constructed by arranging features (original features).

(S2) For each right-angle corner of original features, auxiliary feature is added.

Figure 2A:
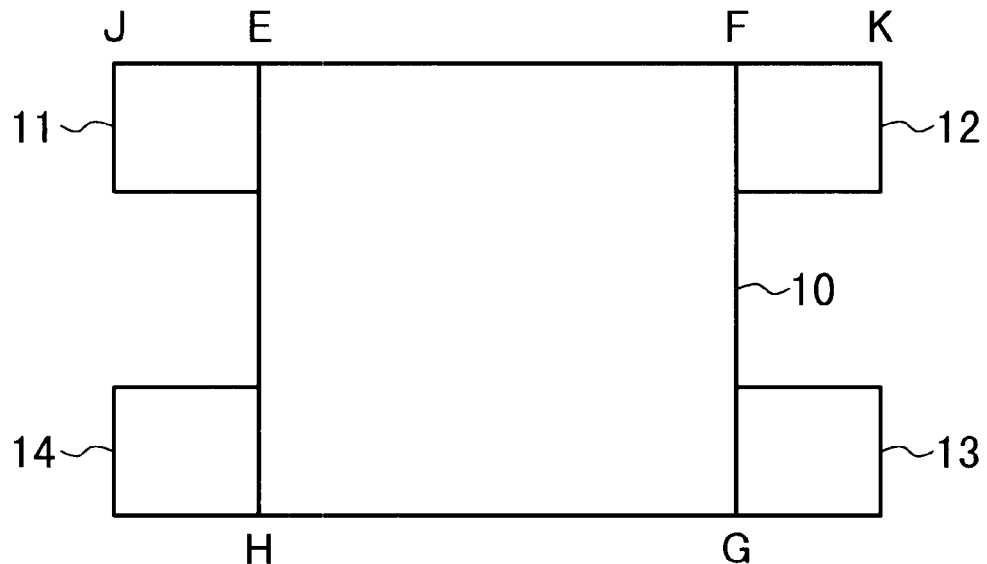
FIGS. 2(A) and 2(B) are illustrations for explaining the steps S2 and S3, respectively, of FIG. 1 in a case where a photomask is fabricated using an electron beam exposure apparatus, in a first embodiment according to the present invention.

As shown in FIG. 2(A) for example, auxiliary features 11 to 14 are added to respective corners of an original rectangular feature 10. The size of each of the auxiliary features 11 to 14 is determined according to the size of the original feature 10 and other photomask fabrication conditions such as beam energy, a dose value and a resist sensitivity. Data of the photomask fabrication conditions are included in the original pattern data file 16.

By adding the auxiliary features 11 to 14 to the original feature 10, the number of figures increases from one to five, therefore a data volume increases much. Hence, in order to decrease the number of figures and thereby reduce a data volume, the following addition is performed and further the following processing in steps S3 and S4 are executed.

That is, the auxiliary features 11 and 12 are added to the corners E and F of the original feature 10 with one side of each of the auxiliary features 11 and 12 being extension of the side EF (sides EJ and FK) and another side of that being in contact with the original feature 10. The auxiliary features 14 and 13 are also added to the corners H and G of the original feature 10 with one side of each of the auxiliary features 14 and 13 being extension of the side HG, which is parallel with the side EF, and another side of that being in contact with the original feature 10.

(S3) A synthesized feature is obtained by performing a geometric OR operation on the original feature and the added auxiliary features.

Figure 2B:
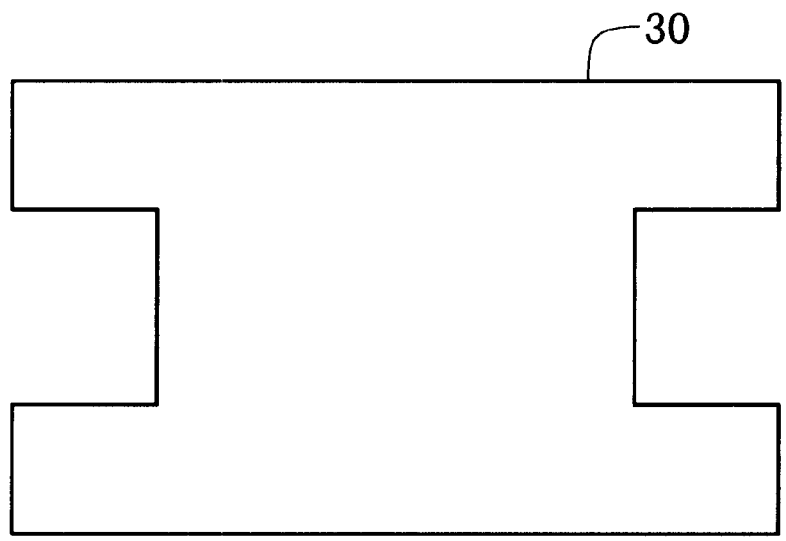

For example, by performing a geometric OR operation between the original feature 10 and the auxiliary features 11 to 14 of FIG. 2(A), a synthesized feature 30 as shown in FIG. 2(B) is obtained. Data of the synthesized feature is represented by a series of vertex coordinates.

(S4) The synthesized feature 30 is decomposed into basic figures which can be processed in an exposure apparatus to be used.

Figure 3A:
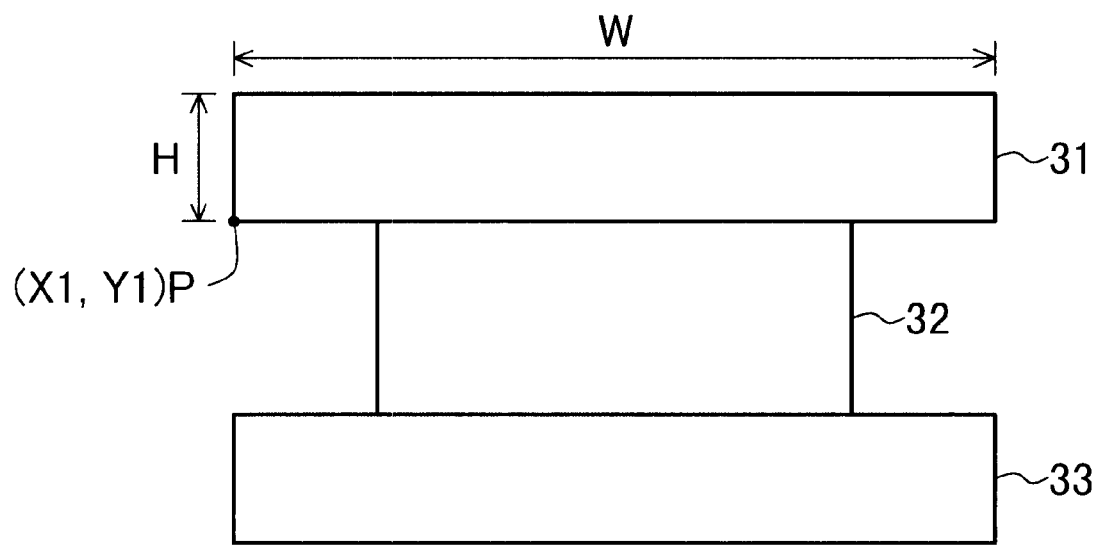
FIG. 3(A) is an illustration for explaining the step S4 of FIG. 1 in the first embodiment according to the present invention.

For example, the synthesized feature 30 is decomposed into basic figures 31 to 33 each having a rectangular shape as shown in FIG. 3(A). The basic figure 31 for example is represented by a figure code indicating a rectangle, the coordinates (X1, Y1) of a reference point P, and the lengths H and W of two adjacent sides. This applies to the basic figures 32 and 33 in a similar way.

By applying such a procedure, the number of basic figures of the corrected figure decreases from 5 in the step S2 down to 3 in the step S4.

(S5) Data of the basic figures obtained by the decomposition are stored into the corrected pattern data file 17.

Figure 3B:
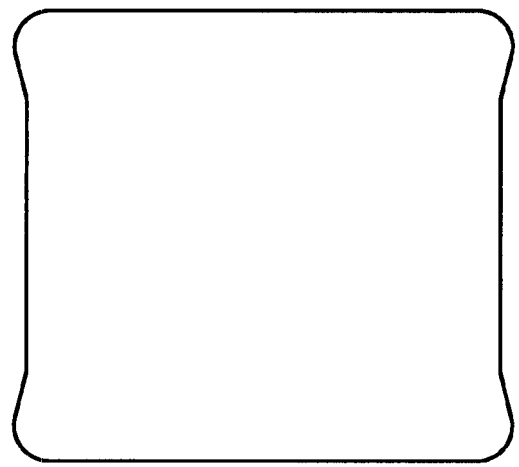
FIG. 3(B) is an illustration showing a final transferred feature obtained by using a photomask on which the corrected pattern feature of FIG. 2(B) is formed.

When the feature of FIG. 2(B) is formed on a photomask and transferred to a photoresist layer on a semiconductor wafer, the proximity effect is compensated by the auxiliary features 11 to 14 to obtain a final transferred feature as shown in FIG. 3(B), which shape is similar to the original feature 10 of FIG. 2(A).

According to the first embodiment, auxiliary features are added to the right-angle corners of an original rectangular feature in such a way as described above, a pattern synthesis is performed using a geometric OR operation on the original and auxiliary features, and the synthesized feature is decomposed into basic figures, and thereby an enormous increase in the number of figures in the corrected mask pattern can be suppressed. Accordingly, a data volume can be reduced by a great deal compared with the prior art, and the throughput of exposure can be also improved.

Second Embodiment

In the second embodiment as well, it is assumed that a photomask is fabricated using an electron beam exposure apparatus.

Figure 4A:
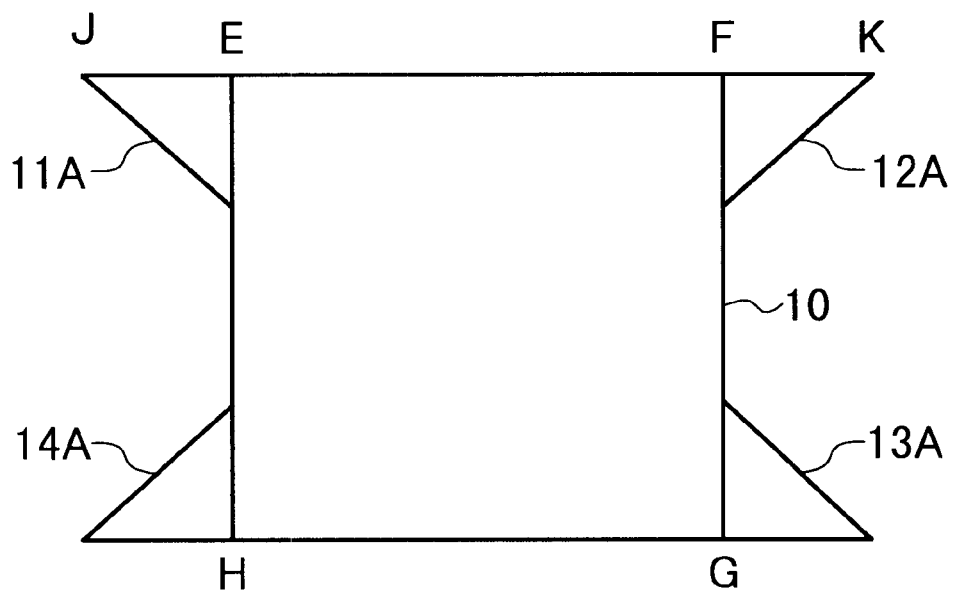
FIGS. 4(A) and 4(B) are illustrations for explaining the steps S2 and S3, respectively, of FIG. 1 in a case where a photomask is fabricated using an electron beam exposure apparatus, in a second embodiment according to the present invention.

In the step S2 of FIG. 1, as shown in FIG. 4(A), auxiliary features 11A to 14A each in the shape of a right triangle, are added to the corners of the original feature 10 similar to the above described manner. That is, the auxiliary features 11A and 12A are added to the corners E and F of the original feature 10 with one side of each of the auxiliary features 11 and 12 being extension of the side EF (sides EJ and FK) and another side of that being in contact with the original feature 10. The auxiliary features 14A and 13A are also added to the corners H and G of the original feature 10 with one side of each of the auxiliary features 14A and 13A being extension of the side HG, which is parallel with the side EF, and another side of that being in contact with the original feature 10.

Figure 4B:
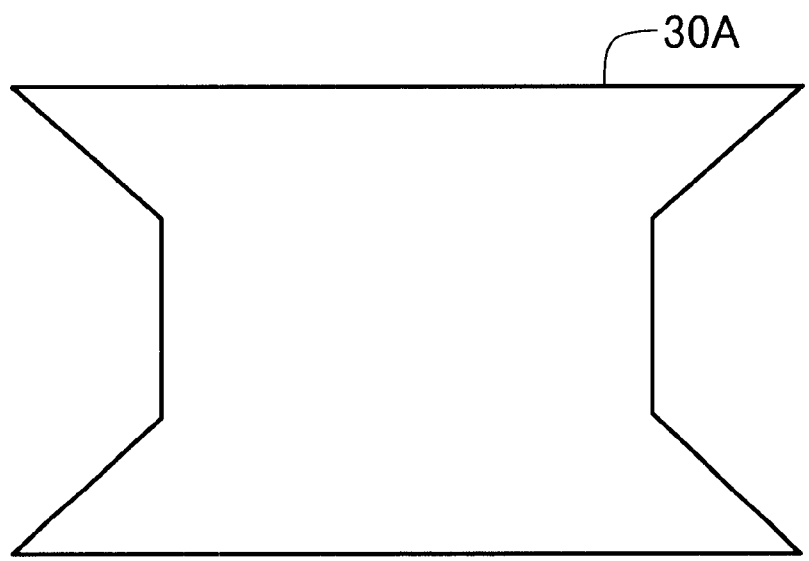

In the step S3 of FIG. 1, by using a geometric OR operation on the original feature 10 and the auxiliary features 11A to 14A of FIG. 4(A), a synthesized feature 30A as shown in FIG. 4(B) is obtained.

Figure 5A:
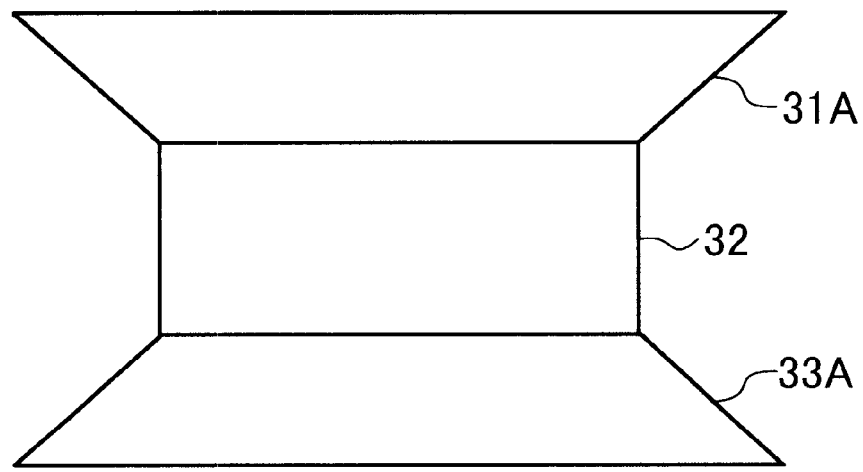
FIG. 5(A) is an illustration for explaining the step S4 of FIG. 1 in the second embodiment according to the present invention.

In the step S4 of FIG. 1, in a case where an exposure apparatus can use not only a rectangle but also a trapezoid as basic figures (the exposure apparatus can scan an electron beam spot on each area of these basic features when the data of these basic figures are provided to the exposure apparatus), the synthesized feature 30A is decomposed into basic figures 31A, 32 and 33A as shown in FIG. 5(A).

Figure 5B:
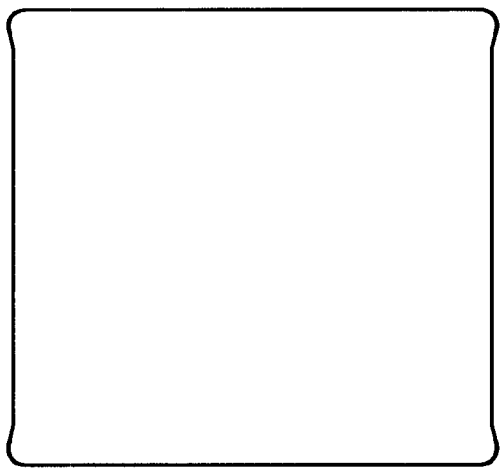
FIG. 5(B) is an illustration showing a final transferred pattern obtained by using a photomask on which the feature of FIG. 4(B) is formed.

When the feature of FIG. 4(B) is formed on a photomask and transferred to a photoresist layer on a semiconductor wafer, the proximity effect is compensated by the auxiliary features 11A to 14A to obtain a final transferred feature as shown in FIG. 5(B), which shape is similar to the original feature 10 of FIG. 4(A).

In the second embodiment as well, the effect of suppressing increase in the number of figures in a mask pattern can be obtained as similar to the first embodiment.

Third Embodiment

In the third embodiment of the present invention, it is assumed that a photomask is fabricated using a laser beam exposure apparatus.

In this case, the shape of auxiliary features and a method of producing a corrected feature for effectively compensating for the proximity effect, are different from the first and second embodiments.

Figure 10A:
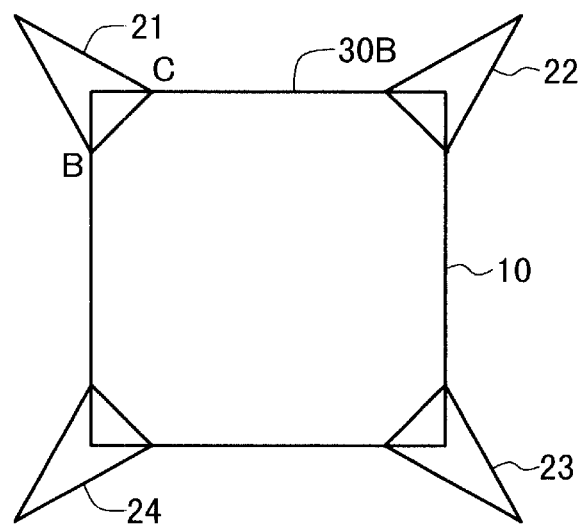
FIG. 10(A) is an illustration for explaining addition of auxiliary features to an original rectangular feature in the prior art in a case where a photomask is fabricated using a laser beam exposure apparatus.

In the step S2 of FIG. 1, as shown in FIG. 10(A) of the prior art, auxiliary features 21 to 24 are radially added to each right-angle corner of the original feature 10.

Figure 6A:
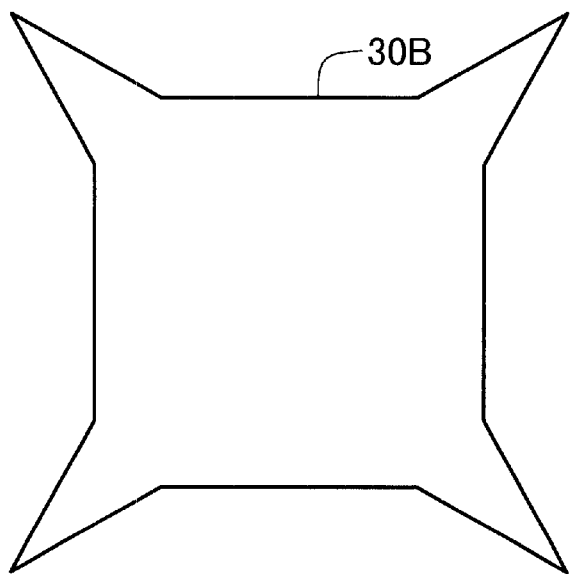
FIGS. 6(A) and 6(B) are illustrations for explaining the steps S3 and S4, respectively, of FIG. 1 in a case where a photomask is fabricated using a laser beam exposure apparatus, in a third embodiment according to the present invention.

In the step S3 of FIG. 1, by performing a geometric OR operation on the original feature 10 of FIG. 10(A) and the auxiliary features 21 to 24, a synthesized feature 30B as shown in FIG. 6(A) is obtained.

Figure 6B:
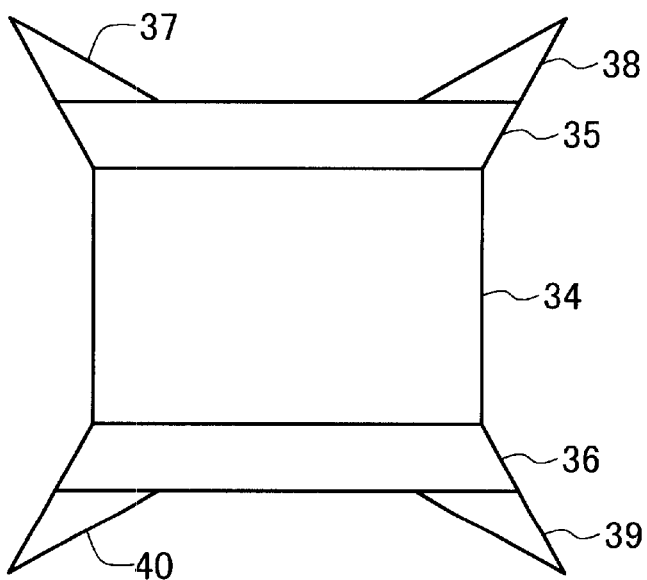

In the step S4 of FIG. 1, in a case where an exposure apparatus can use not only a rectangle and a triangle but also a trapezoid as basic figures, the synthesized feature 30B is, as shown in FIG. 6(B), decomposed into basic figures 34 to 39, each being of a rectangle, a trapezoid or a triangle having one side which is parallel with a side of the rectangle 34.

Figure 7:
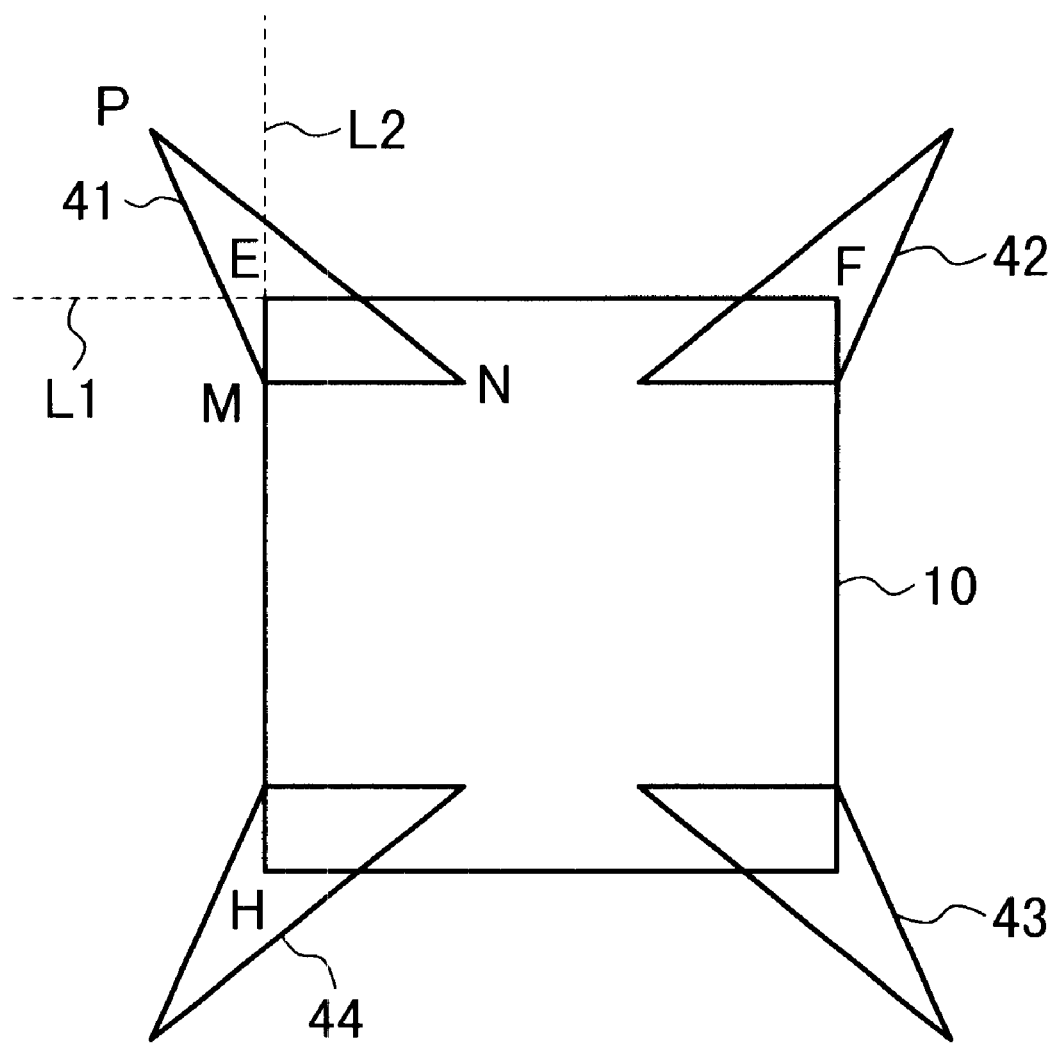
FIG. 7 is an illustration for explaining addition of auxiliary features in a case where a photomask is fabricated using a laser beam exposure apparatus, in a fourth embodiment according to the present invention.
Figure 8A:
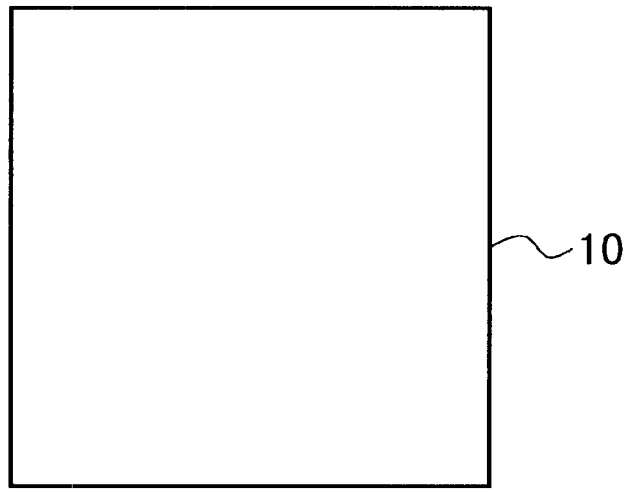
Figure 8B:
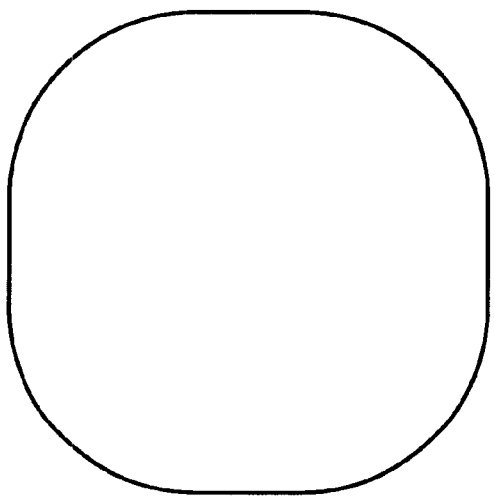
Figure 10B:
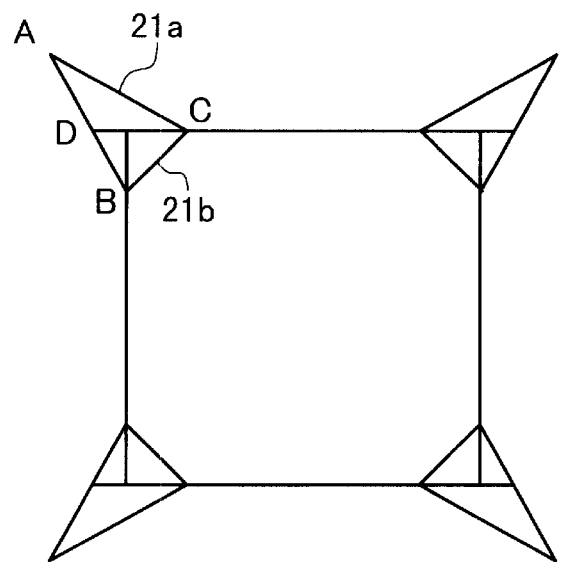
FIG. 10(B) is an illustration showing the corrected feature of FIG. 10(A) whose auxiliary features are decomposed into basic figures.

With such a procedure, the number of figures in the corrected feature decreases from 9 as in FIG. 10(B) to 7 as in FIG. 6(B).

Figure 9A:
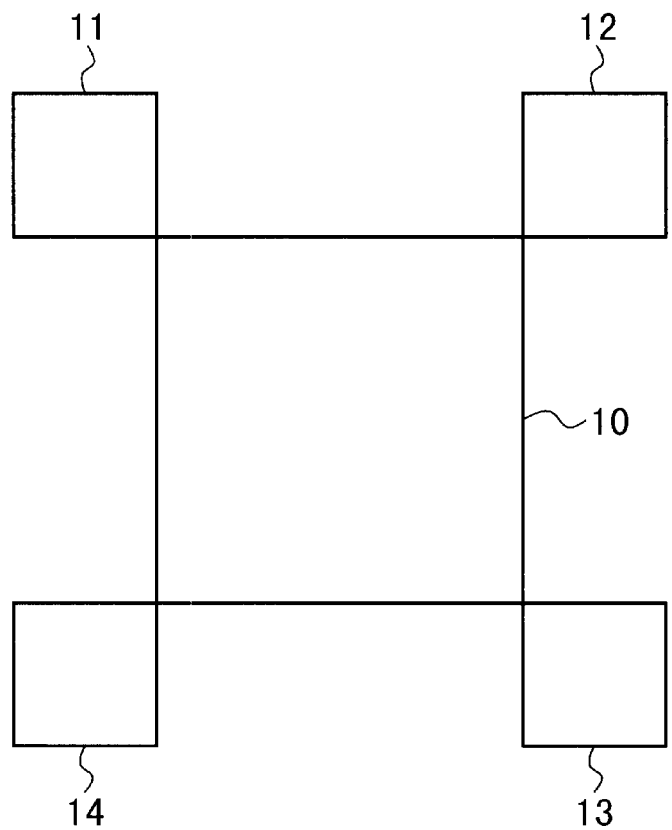
FIG. 9(A) is an illustration for explaining addition of auxiliary features to an original rectangular feature in the prior art in a case where a photomask is fabricated using an electron beam exposure apparatus.
Figure 9B:
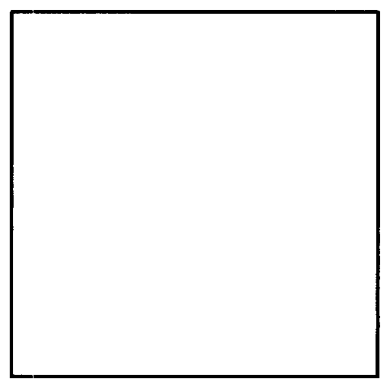
FIG. 9(B) is an illustration showing a final transferred feature obtained by using a photomask on which the feature of FIG. 9(A) is formed.

The third embodiment is the same as the prior art with respect to the effect that a final transferred feature is such one as shown in FIG. 9(B).

Fourth Embodiment

In the fourth embodiment of the present invention as well, it is assumed that a photomask is fabricated using a laser beam exposure apparatus.

When auxiliary features in the shape as shown in FIG. 10(A) are added, the number of figures in the corrected feature is 9 as shown in FIG. 10(B), therefore the data volume of a mask pattern increases. Hence, in order to suppress an enormous increase in the number of figures in the corrected mask pattern, in the step S2 of FIG. 1, as shown in FIG. 7, auxiliary features 41 to 44 each in the shape of a triangle having a side which is parallel with a side of the rectangular pattern 10, are radially added to the corners of the original rectangular feature 10.

The auxiliary feature 41 is a triangle having a side MN which is parallel with the side EF of the original feature 10 and is inside the original feature 10, and having a vertex P which is inside the area between partitioning lines L1 and L2 which are outward extensions of adjacent sides EF and EH intersecting at the corner. This applies to the other auxiliary features 42 and 44 in a similar way. Note that especially, in FIG. 7, a side of each of the auxiliary features 41 to 44 is parallel with the side EF of the original feature 10.

With addition of such auxiliary features 41 to 44, the number of figures in the corrected feature decreases from 9 as in FIG. 10(B) to 5 as in FIG. 7.

The auxiliary features 41 to 44 are used in exposure in an overlapped manner with the original feature 10, therefore the data of the auxiliary features 41 to 44 are independent of the data of the original feature 10. Due to overlap exposure, the processing's of the steps S3 and S4 of FIG. 1 are omitted.

Although preferred embodiments of the present invention has been described, it is to be understood that the invention is not limited thereto and that various changes and modifications may be made without departing from the spirit and scope of the invention.

For example, in FIG. 7, the side MN of the auxiliary feature 41 may partly protrude from the original feature 10.

Further, with the original pattern data file 16 including the data of indicating which of an electron beam exposure or a laser beam exposure is used, a data processing apparatus for compensating for the proximity effect may selectively perform the second or fourth embodiments described above.

What is claimed is:

1. A photomask having a corrected pattern, said corrected pattern having an original feature and first and second auxiliary features for said original feature, said first and second auxiliary features being added to both adjacent corners of said original feature, said both adjacent corners being located at both ends of a first side of said original feature, wherein each of said auxiliary features is a figure of a triangle or a tetragon, said figure having one side which is an extension of said first side, said figure having another side which is a portion of a second side of said original feature, said second side being adjacent to said first side.

2. A photomask having a corrected pattern, said corrected pattern having an original feature and first and second auxiliary features for said original feature, said first and second auxiliary features being added to both adjacent corners of said original feature, said both adjacent corners being located at both ends of a first side of said original feature, wherein each of said auxiliary features is a triangle, said triangle having one side which is parallel with said first side and at least a portion of said one side being inside said original feature, said triangle having a vertex which is disposed outside said original feature and inside an area between first and second partitioning lines, said first and second partitioning lines being outward extensions of said first side and a second side of said original feature, said first and second sides forming corresponding to one of said adjacent corners, said triangle including within its interior said one of adjacent corners.

3. A data processing apparatus equipped with a computer on which a computer program is installed, said computer program causing said computer to produce data of a corrected photomask pattern in order to fabricate a photomask using an electron beam exposure apparatus, said corrected pattern having an original feature and first and second auxiliary features for said original feature in order to compensate for the photo proximity effect, wherein said computer program causes said computer to perform a process comprising:

inputting data of said original feature;

adding said first and second auxiliary features to both adjacent corners of said original feature, said both adjacent corners being located at both ends of a first side of said original feature, each of said first and second auxiliary features being a figure of a triangle or a tetragon, said figure having one side which is an extension of said first side, said figure having another side which is a portion of a second side of said original feature, said second side being adjacent to said first side;

performing a geometric OR operation on said original feature and said first and second auxiliary features to obtain a synthesized feature; and decomposing said synthesized feature into basic figures which can be processed in said electron beam exposure apparatus.

4. A method of producing data of a corrected photomask pattern by a computer in order to fabricate a photomask using an electron beam exposure apparatus, said corrected pattern having an original feature and first and second auxiliary features for said original feature in order to compensate for the photo proximity effect, wherein said method comprises:

inputting data of said original feature;

adding said first and second auxiliary features to both adjacent corners of said original feature, said both adjacent corners being located at both ends of a first side of said original feature, each of said first and second auxiliary features being a figure of a triangle or a tetragon, said figure having one side which is an extension of said first side, said figure having another side which is a portion of a second side of said original feature, said second side being adjacent to said first side;

performing a geometric OR operation on said original feature and said first and second auxiliary features to obtain a synthesized feature; and decomposing said synthesized feature into basic figures which can be processed in said electron beam exposure apparatus.

5. A data processing apparatus equipped with a computer on which a computer program is installed, said computer program causing said computer to produce data of a corrected photomask pattern in order to fabricate a photomask using an laser beam exposure apparatus, said corrected pattern having an original feature and first and second auxiliary features for said original feature in order to compensate for the photo proximity effect, wherein said computer program causes said computer to perform a process comprising:

inputting data of said original feature; and adding said first and second auxiliary features to both adjacent corners of said original feature, said both adjacent corners being located at both ends of a first side of said original feature, each of said first and second auxiliary features being a triangle, said triangle having one side which is parallel with said first side and at least a portion of said one side being inside said original feature, said triangle having a vertex which is disposed outside said original feature and inside an area between first and second partitioning lines, said first and second partitioning lines being outward extensions of said first side and a second side of said original feature, said first and second sides forming corresponding one of said adjacent corners, wherein data of said auxiliary features are independent of data of said original feature in overlap region therebetween due to overlap exposure, said triangle including within its interior said one of adjacent corners.

6. A method of producing data of a corrected photomask pattern by a computer in order to fabricate a photomask using an laser beam exposure apparatus, said corrected pattern having an original feature and first and second auxiliary features for said original feature in order to compensate for the photo proximity effect, wherein said method comprises:

inputting data of said original feature; and adding said first and second auxiliary features to both adjacent corners of said original feature, said both adjacent corners being located at both ends of a first side of said original feature, each of said first and second auxiliary features being a triangle, said triangle having one side which is parallel with said first side and at least a portion of said one side being inside said original feature, said triangle having a vertex which is disposed outside said original feature and inside an area between first and second partitioning lines, said first and second partitioning lines being outward extensions of said first side and a second side of said original feature, said first and second sides forming corresponding one of said adjacent corners, wherein data of said auxiliary features are independent of data of said original feature in overlap region therebetween due to overlap exposure, said triangle including within its interior said one of adjacent corners.

7. A computer program product, comprising: a computer readable storage medium having a computer program stored thereon for causing a computer to produce data of a corrected photomask pattern in order to fabricate a photomask using an electron beam exposure apparatus, said corrected pattern having an original feature and first and second auxiliary features for said original feature in order to compensate for the photo proximity effect, wherein said computer program causes said computer to perform a process comprising:

inputting data of said original feature;

adding said first and second auxiliary features to both adjacent corners of said original feature, said both adjacent corners being located at both ends of a first side of said original feature, each of said first and second auxiliary features being a figure of a triangle or a tetragon, said figure having one side which is an extension of said first side, said figure having another side which is a portion of a second side of said original feature, said second side being adjacent to said first side;

performing a geometric OR operation on said original feature and said first and second auxiliary features to obtain a synthesized feature; and decomposing said synthesized feature into basic figures which can be processed in said electron beam exposure apparatus.

8. A computer program product, comprising: a computer readable storage medium having a computer program stored thereon for causing a computer to produce data of a corrected photomask pattern in order to fabricate a photomask using an laser beam exposure apparatus, said corrected pattern having an original feature and first and second auxiliary features for said original feature in order to compensate for the photo proximity effect, wherein said computer program causes said computer to perform a process comprising:

inputting data of said original feature; and adding said first and second auxiliary features to both adjacent corners of said original feature, said both adjacent corners being located at both ends of a first side of said original feature, each of said first and second auxiliary features being a triangle, said triangle having one side which is parallel with said first side and at least a portion of said one side being inside said original feature, said triangle having a vertex which is disposed outside said original feature and inside an area between first and second partitioning lines, said first and second partitioning lines being outward extensions of said first side and a second side of said original feature, said first and second sides forming corresponding one of said adjacent corners, wherein data of said auxiliary features are independent of data of said original feature in overlap region therebetween due to overlap exposure, said triangle including within its interior said one of adjacent corners.

9. A photomask having a corrected pattern, the corrected pattern having an original feature in the shape of an original corner, the original corner comprising two original sides and an original vertex where the two original sides intersect, and an auxiliary feature for the original corner, wherein the auxiliary feature is in the shape of a concave tetragon, the concave tetragon comprising two sides that intersect to form a concave vertex, where the corrected pattern has the shape of the concave tetragon added to the original corner such that the concave vertex is colocated with the original vertex, and such that the two sides of the tetragon overlap the two original sides of the original corner, the shapes having been formed by adding a triangle with a vertex inside the original corner.

10. A geometrically reduced photomask representation, the representation comprising information representing shapes, the shapes arranged to form a corrected pattern, the corrected pattern having a shape comprising:

a triangle ABC;

a trapezoid ADEF with two parallel sides AD and EF, AD being longer than EF; and a tetragon FEGH, where the triangle, trapezoid, and tetragon are arranged such that side AB of triangle ABC overlaps and is common with side AD of the trapezoid, vertex C of triangle ABC is outside of the trapezoid and the tetragon, and side AD of the trapezoid is outside the tetragon, wherein a portion of side AD of the trapezoid is an original feature side having been extended by a portion of side AB of triangle ABC.

11. A photomask according to claim 10, wherein the photomask is formed by adding a triangle FCI to an original feature, where vertex I is on the side EF of the trapezoid and is inside the original feature.

* * * * *